United States Patent [19]

Mizusawa et al.

[11] Patent Number: 5,390,227
[45] Date of Patent: Feb. 14, 1995

[54] EXPOSURE APPARATUS

[75] Inventors: Nobutoshi Mizusawa, Yamato; Ryuichi Ebinuma, Kawasaki; Takao Kariya, Hino; Isamu Shimoda, Zama; Shunichi Uzawa, Tokyo, all of Japan

[73] Assignee: Canon Kabushiki Kaisha, Tokyo, Japan

[21] Appl. No.: 62,151

[22] Filed: May 17, 1993

Related U.S. Application Data

[63] Continuation of Ser. No. 811,916, Dec. 23, 1991, abandoned, which is a continuation of Ser. No. 729,846, Jul. 12, 1991, abandoned, which is a continuation of Ser. No. 404,612, Sep. 8, 1989, abandoned.

[30] Foreign Application Priority Data

Sep. 9, 1988 [JP] Japan ................................ 63-224712
Sep. 9, 1988 [JP] Japan ................................ 63-224713

[51] Int. Cl.$^6$ ............................................. G21K 5/00
[52] U.S. Cl. ....................................... 378/34; 378/150; 378/206
[58] Field of Search ................ 378/34, 35, 150–152, 378/205–206

[56] References Cited

U.S. PATENT DOCUMENTS

| | | | |
|---|---|---|---|
| 2,667,588 | 1/1954 | Oswald | 378/152 |
| 2,905,827 | 9/1959 | Graves | 378/150 |
| 4,403,336 | 9/1983 | Taniguchi et al. | 378/34 |
| 4,464,778 | 8/1984 | Goldmann | 378/150 |
| 4,516,254 | 5/1985 | Komeyama et al. | 378/34 |
| 4,803,712 | 2/1989 | Kembo et al. | 378/34 |
| 4,825,453 | 4/1989 | Kembo et al. | 378/34 |
| 4,856,037 | 8/1989 | Mueller et al. | 378/34 |

FOREIGN PATENT DOCUMENTS

| | | |
|---|---|---|
| 0136672 | 4/1985 | European Pat. Off. . |
| 0253283 | 1/1988 | European Pat. Off. . |
| 0169242 | 10/1982 | Japan ................... 378/34 |
| 62-160724 | 7/1987 | Japan . |

OTHER PUBLICATIONS

Patent Abstracts of Japan, Kokai No. 60–30132, vol. 9, No. 150, Jun. 1985.
Patent Abstracts of Japan, Kokai No. 61–51824, vol. 10, No. 213, Jul. 1986.

*Primary Examiner*—Craig E. Church
*Attorney, Agent, or Firm*—Fitzpatrick, Cella, Harper & Scinto

[57] ABSTRACT

An exposure apparatus for exposing a semiconductor wafer to a semiconductor device pattern formed in a mask. The exposure energy is, for example, X-rays contains in synchrotron orbit radiation. A blade for limiting the area irradiated with the exposure energy on a mask or wafer is integrally movable in an alignment detecting unit for detecting the alignment mark. Four of such blades are provided to provide a square exposure area. The blades are movable independently by the associated alignment detecting units. Each of the blades is finely movable relative to the associated alignment detecting unit. The shape or size or the like of the blade is determined in consideration of the position of the blade in the direction of the exposure energy irradiation, and the maximum and minimum exposure view angle. The blade is cooled. The exposure area can be changed highly accurately and efficiently with a simple structure.

17 Claims, 8 Drawing Sheets

EXPOSURE APPARATUS

FIELD OF THE INVENTION AND RELATED ARTS

This application is a continuation of prior application, Ser. No. 07/811,916 filed Dec. 23, 1991, which application is a continuation of prior application, Ser. No. 07/729,846 filed Jul. 12, 1991, which application is a continuation of prior application, Ser. No. 07/404,612 filed Sep. 8, 1989, all now abandoned.

The present invention relates to an exposure apparatus wherein a pattern of an original is transferred or printed on a substrate facing the original with an exposure beam.

In an exposure apparatus used for manufacturing semiconductor devices, a pattern formed in the original such as a mask or a reticle is projected onto a substrate such as a wafer or glass, using an exposure beam, by which a photoresist applied on the substrate is exposed to the pattern, so that the pattern is transferred onto the resist. In this case, means for limiting the exposure beam is provided, as the case may be, so as to prevent unnecessary portions of the exposure beam directed to the mask or the reticle from reaching the mask or the reticle.

For example, in a pattern exposure for manufacturing an integrated circuit, scribe lines are provided around a regular square or rectangular circuit pattern area. The scribe lines have a width of 50–100 microns and have alignment marks for aligning the mask and the wafer. If the exposure beam is applied over the whole surface of the mask, the alignment marks in the scribe lines are also printed on the wafer together with the circuit pattern. One method of avoiding this is that blades having linear blocking edges are used to cover the scribe lines to prevent the scribe line from being exposed to the exposure beam.

Particularly, in an X-ray exposure apparatus, the light (radiation) applied to the mask is not reflected by the mask but is absorbed thereby, and therefore, it is converted to thermal energy with the result of production of thermal deformation in a mask, as contrasted to the other exposure apparatus. Therefore, it is preferable that the means for limiting the exposure beam is provided to prevent the light from reaching the unnecessary part of the mask.

SUMMARY OF THE INVENTION

However, in such an apparatus as described above, the region to which the exposure beam is limited changes in accordance with the size of the circuit pattern, and therefore, the necessity results to move the blades in accordance with the size of the circuit pattern. This further necessitates an actuator and guiding mechanism for moving the blades in predetermined directions, thus making the entire structure of the apparatus complicated.

Since the positioning of the blades has to be highly accurate, the guiding mechanism has to have high rigidity and high rectilinearity, and in addition, position detecting means having high resolution is required, with the result that the weight and the cost of the apparatus is increased.

In the X-ray exposure apparatus, the use, as in the conventional apparatus, of the blades for limiting the exposure beam is effective to suppress the temperature rise attributable to the absorption of the exposure beam energy by the mask itself. However, this results in the temperature rise of the blade limiting the exposure beam. In the exposure apparatus, particularly, wherein the highly accurate alignment is required, even a small thermal deformation of a constituent member as well as the thermal deformation of the mask is a problem, and therefore, the temperature rise of the blades is not preferable.

Accordingly, it is a principal object of the present invention to provide an exposure apparatus wherein the exposure beam is effectively limited, and the temperature rise is suppressed, with a simple structure.

According to an aspect of the present invention, there is provided an exposure apparatus comprising exposure means for transferring a pattern of an original onto a substrate, deviation detecting means for detecting a deviation between alignment marks of the original and the substrate, positioning means for positioning the deviation detecting means and exposure beam limiting means for limiting the exposure beam provided by the exposure means, wherein the exposure beam limiting means is mounted integrally with the deviation detecting means.

In an embodiment, four of the deviation detecting means are provided in the respective orientations different by 90 degrees, and the exposure beam limiting means is provided with a plate having a linear edge for limiting the exposure beam, and wherein an amount of projection of the edge into the exposure view angle region is not more than $L_A \times l_{min}/(2 \times L_M)$ where $L_M$ and $L_A$ are distances, measured along the optical axis of the exposure beam, to the original from a point of origin of the divergence of the exposure beam provided by the exposure means and the edge of the plate, respectively; and $l_{min}$ is a length of a side of the minimum angle of view limited by the exposure beam limiting means.

In an embodiment, the exposure beam limiting means is provided with a fine displacing means for displacing the plate in the direction perpendicular to the edge by a small distance.

Thus, the deviation detecting means for detecting the amount of deviation between the original and the substrate facing each other and the exposure limiting means, are integrally moved by the positioning means during the operation. Therefore, it is not necessary to employ a moving and positioning means exclusively for the exposure beam limiting means. In addition, the positioning of the exposure beam limiting means is effected by the positioning of the deviation detecting means integral therewith relative to the alignment mark, and therefore, the position of the exposure beam limiting means is very accurately determined in accordance with the view angle.

In an embodiment, the exposure beam limiting means is provided with cooling means, and therefore, even if the X-rays are used for the exposure beam, the temperature rise of the exposure beam limiting means is suppressed, thus assuring a highly precise alignment.

When the deviation detecting means (alignment unit) having, as a principal function, for executing the positioning relative to the alignment mark on the scribe line carries the exposure beam limiting means (blade), the alignment unit moves in two dimensions in accordance with the change of the size of the view angle and the position in the scribe line where the alignment mark is depicted. For this reason, some problems arise. That is, the adjacent blades are more interfered with each other than in the conventional masking blade which is movable only in the direction perpendicular to the scribe line. In addition, the space required to allow movement of the blade has to be free and cannot accommodate any other parts.

Accordingly, it is a second object of the present invention to provide an exposure apparatus wherein a blade for limiting the exposure beam is integral with the alignment unit with high compactness.

According to this aspect of the present invention, there is provided an exposure apparatus comprising exposure means for transferring a pattern of an original onto a substrate, first exposure beam limiting means for limiting the exposure beam provided by the exposure means to an angle of view necessary and sufficient to irradiate the maximum angle of view, deviation detecting means for detecting the deviation between the alignment mark of the original and the alignment mark of the substrate, displacing means for displacing and positioning the deviation detecting means in accordance with a position of the alignment mark of the original and second exposure means control means having a blade in the form of a plate fixed to the deviation detecting means to further limit the exposure means to a proper angle of view, wherein the length of the blade measured in the direction perpendicular to the view angle limiting edge is slightly larger than $(l_{EX} - l_{min})/2$, where $l_{EX}$ is a length of the maximum exposure view angle in the direction perpendicular to the view angle limiting edge; and $l_{min}$ is the length of the minimum exposure view angle in the same direction, and the length of the blade measured along the edge is slightly larger than $l_{max} + l_{STG}$, where $l_{STG}$ is a distance through which the detecting means moves along the edge by the displacing means, and adjacent ones of the blades are mounted to the deviation detecting means at different levels.

With this structure, the view angle (irradiation area) in which the exposure beam is irradiated during the exposure operation is changeable from the maximum exposure view angle to the minimum exposure view angle in accordance with the size of the circuit pattern of the original, and in addition, the position of the alignment mark in the scribe line of the original changes together in two dimensions. In the alignment operation prior to the exposure operation, the deviation detecting means displaces in accordance with the position of the alignment mark to detect the alignment mark. Since the blade moves together, the blade can cover the portion not requiring the exposure, such as the scribe line. Also, since the dimensions of the blade are defined in the manner described above, they are made of sufficient and minimum dimensions so as to cover the portion not requiring the exposure over the entire range of the changeable view angle, thus minimizing the wasteful space. In other words, the exposure beam is limited properly by the positioning of the detecting means.

These and other objects, features and advantages of the present invention will become more apparent upon a consideration of the following description of the preferred embodiments of the present invention taken in conjunction with the accompanying drawings.

DETAILED DESCRIPTION OF THE PREFERRED EMBODIMENTS

Figure 1:
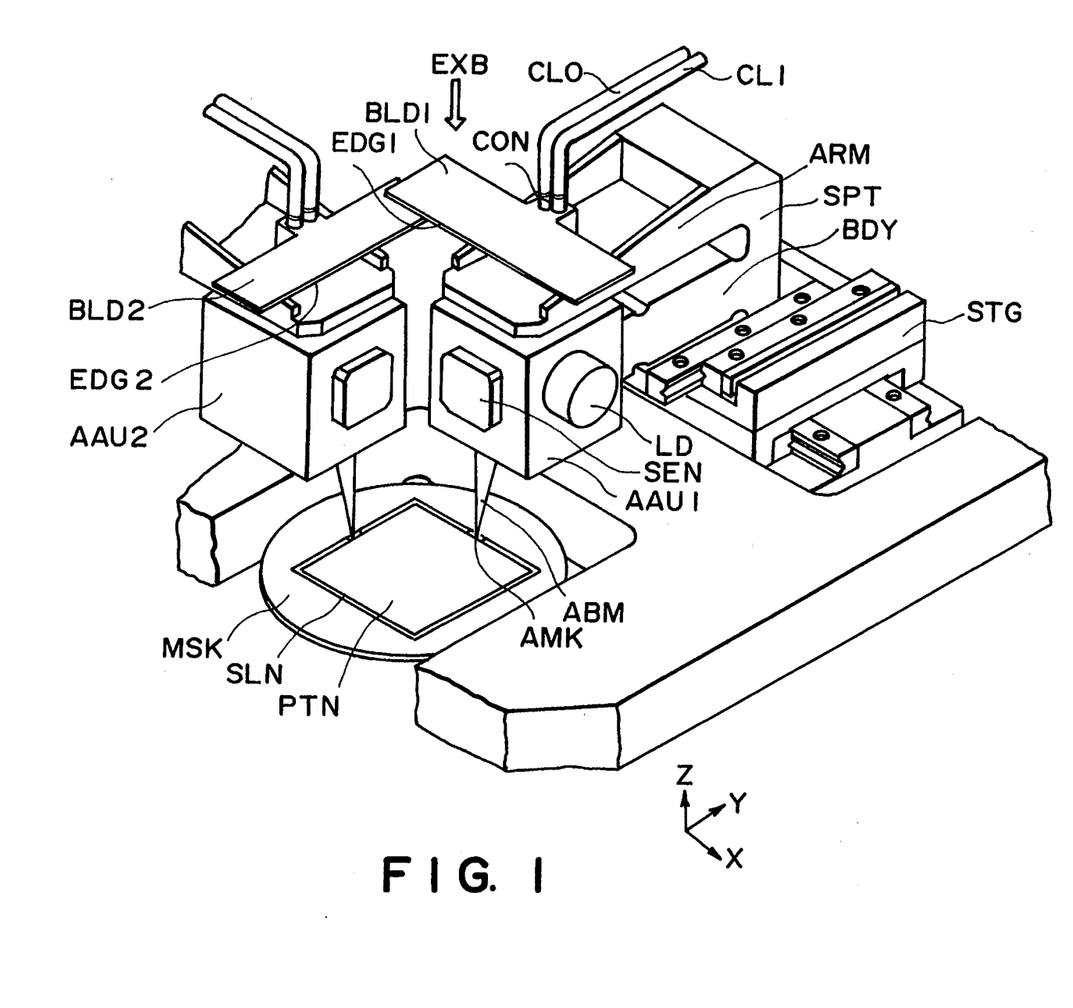
FIG. 1 is a perspective view of a major portion of an exposure apparatus according to an embodiment of the present invention.

FIG. 1 shows a major portion of the exposure apparatus according to an embodiment of the present invention, and it best shows the feature of this embodiment. A mask MSK includes a pattern SLN corresponding to the scribe line of the mask MSK, and a pattern PTN of a semiconductor device circuit to be printed on an unshown semiconductor wafer and, an alignment mark AMK on the scribe line pattern SLN. The apparatus includes an alignment unit AAU1 for projecting an alignment beam AMB onto the alignment mark AMK to detect the deviation between the alignment mark on an unshown wafer and the alignment mark AMK on the mask MSK, a supporting member SPT on which the alignment unit AAU1 is fixedly supported, a semiconductor laser accommodating portion LD which is a light source for the alignment beam AMB, and a photosensor accommodating portion SEN for accommodating a photosensor for converting an optical deviation signal from the alignment mark AMK to an electric signal. The alignment unit AAU1 includes a collimator lens, a beam splitter means, a light receiving lens or other optical element. A blade BLD1 functions to limit the irradiation area of the mask MSK by the exposure beam EXB supplied in the direction indicated by an arrow (Z axis direction). The blade BLD1 is in the form of a rectangular plate and is securedly fixed on the supporting member SPT through an arm ARM. The blade BLD1 is provided with pipes CLI and CLO for cooling function, and cooling passages are formed in the blade.

The apparatus includes a stage unit STG constituted by guiding and driving means movable in two orthogonal axes (X and Y axes) and position detecting means. The supporting member SPT is coupled with the stage unit STG so that the alignment beam ABM is positioned on the alignment mark AMK of the mask MSK. In the apparatus, four of the above-described alignment units are provided, corresponding to the alignment marks AMK in the four scribed lines around the pattern PTN. Therefore, one exposure apparatus is provided with four blades (BLD1, BLD2, BLD3 and BLD4) and four alignment units (AAU1, AAU2, AAU3 and AAU4). In the following description, therefore, the reference character for the blade is "BLD", and that for the alignment unit is "AAU", unless a particular one of them is referred to.

Figures 2A, 2B:
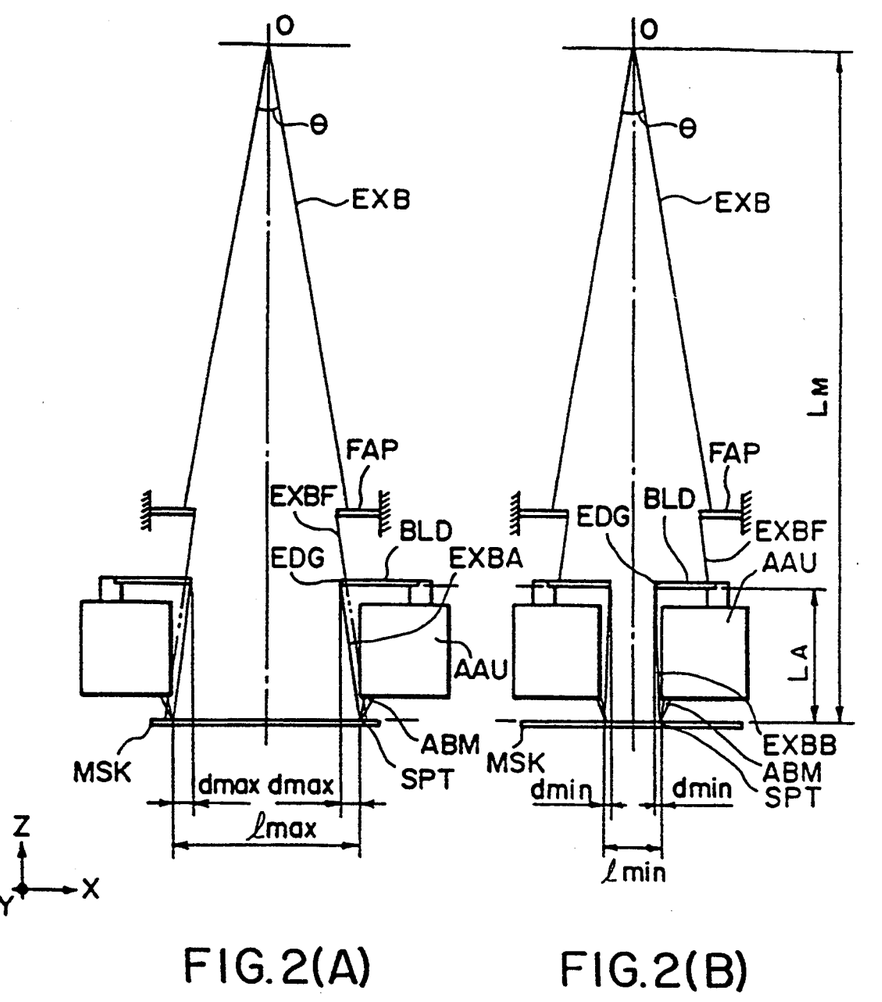
FIGS. 2(A) and 2(B) are schematic views illustrating the relationship between the blade and the exposure beam of the apparatus of FIG. 1.

FIGS. 2(A) and 2(B) a relationship between the blade and the exposure beam of the apparatus of FIG. 1, as seen in the direction y. As shown, the exposure beam EXB is a divergent beam having a point of origin O and having a divergent angle $\theta$. In this embodiment, the exposure beam is X-rays contained in synchrotron orbital radiation. The exposure beam EXB is confined or limited first by a fixed aperture stop FAP. The limited beam is indicated by a reference EXBF. In FIG. 2(A), $l_{max}$ indicates the maximum exposure angle range of view on the mask MSK. The size of the aperture of the fixed aperture stop FAP is determined so that the exposure beam EXBF irradiates slightly beyond the maximum exposure view angle, as shown by chain lines. The exposure beam EXBF having passed through the fixed aperture FAP is further confined or limited by the blade BLD fixed on the alignment unit AAU.

Figures 3, 4:
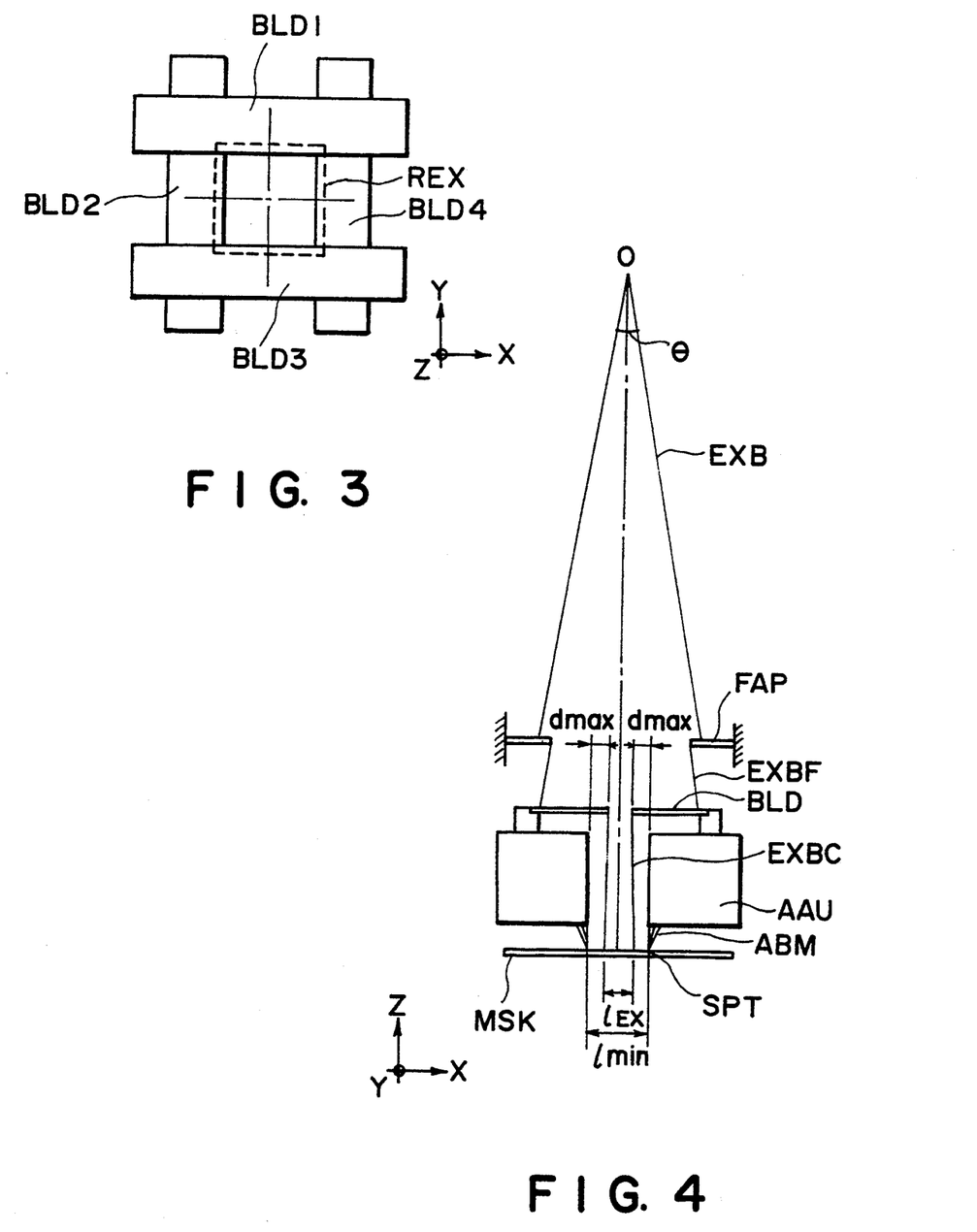
FIG. 3 is a schematic view seen from a beam source side, illustrating the blade arrangement carried on the alignment units in the apparatus of FIG. 1.
FIG. 4 illustrates operation of the apparatus of FIG. 1, in conjunction with FIG. 2.

FIG. 3 shows the arrangement of the blades BLD1–BLD4 on the alignment unit AAU, as seen from the light (radiation) source, that is, in the direction of the z axis. The adjacent blades, for example, the blade BL1 and the blade BL2 are at different levels (positions in the z axis direction), and therefore, they do not interfere with each other irrespective of the size of the view angle.

The description will be made as to the relation between the size of the view angle and the blade mounting position in this structure.

In FIG. 2(A) shows the state wherein a spot SPT formed by the alignment beam AMB accesses the scribe line in the case of the maximum view angle $l_{max}$, and FIG. 2(B) shows a state wherein the spot SPT by the alignment beam AMB accesses the scribe line in the case of the minimum view angle $l_{min}$. The respective blades are fixed to the associated alignment unit AAU so that the exposure beam is incident slightly beyond the outer edges of the scribe lines. In order to accomplish this, the blade is projected beyond the outer edge of the scribe line into the view angle range in a direction parallel to the X-Y plane, more particularly, in the X axis direction in this figure, by the amount $d_{max}$ in FIG. 2(A) and $d_{min}$ in FIG. 2(B). The amount d of the projection of the blade BLD, is $$d = L_A \times (l/2L_M) \quad (1)$$

where l is a size of the view angle in the X (Y) axis direction, $L_M$ is a distance from the point of origin O of the exposure beam having a divergence angle $\theta$ to the mask MSK measured in the Z axis direction; and $L_A$ is a distance from the edge ADG of the blade BLD to the mask MSK measured in the Z axis direction.

Therefore, $d_{max}$ and $d_{min}$ are:

$$d_{max} = L_A \times (l_{max}/2L_M) \quad (2)$$

$$d_{min} = L_A \times (l_{min}/2L_M) \quad (3)$$

If, for example, $L_A = 150$ mm, $L_M = 50000$ mm, $l_{max} = 30$ mm, $l_{min} = 15$ mm, then $d_{max} = 0.45$ mm, and $d_{min} = 0.225$ mm. In consideration of the blade function, it is preferable that the blade edge EDG provides a boundary between the exposure area and the non-exposure area, which is as close to the outer edge of the scribe line as possible. However, if the blade BLD is set in consideration only of the maximum view angle shown in FIG. 2(A), then the light blocking area extends into the view angle $l_{min}$ as shown in FIG. 4, in the case of the minimum view angle. Therefore, the required view angle cannot be obtained. Therefore, when the blade BLD is fixed to the alignment unit AAU, the blade is set to meet the minimum view angle $l_{min}$, and the amount d of the projection is not more than $$L_A \times l_{min}/2 \times L_M.$$

By disposing the blade at such a position and by fixing the blade BLD on the alignment unit AAU, the blade BLD can be moved to a proper position in accordance with the view angle size without the necessity of employing the positioning means exclusively for the blade. Generally, the alignment between the alignment mark AMK and the alignment beam spot SPT is as accurate as not more than 10 microns, and therefore, the positioning of the blade BLD is automatically very high. It is possible for the blade BLD to block almost all of the exposure beam that is not desired to reach the mask MSK.

Figure 5:
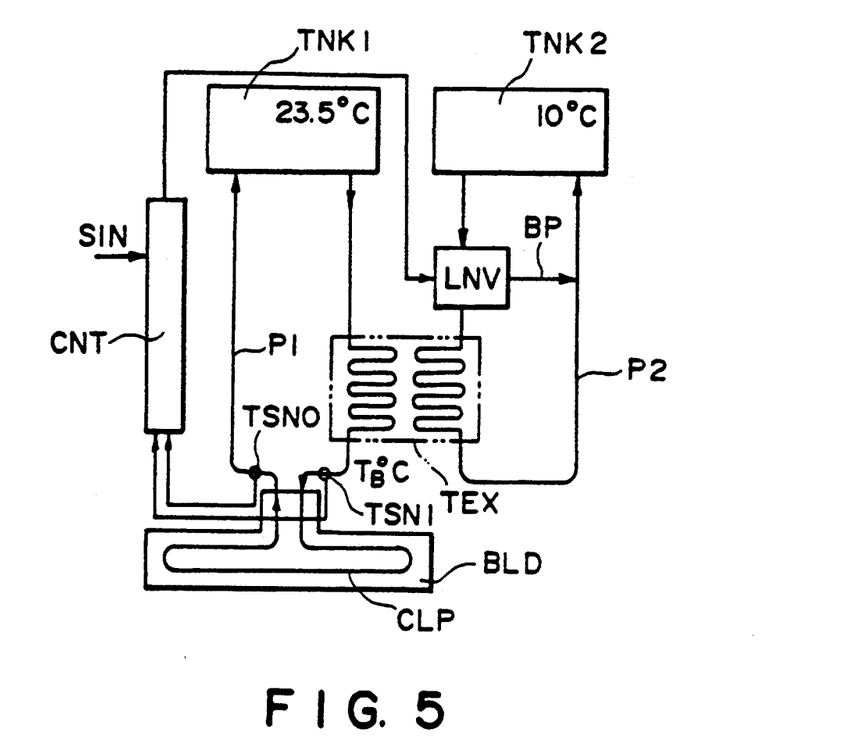
FIG. 5 shows a cooling system used with the apparatus of FIG. 1.
Figure 6A:
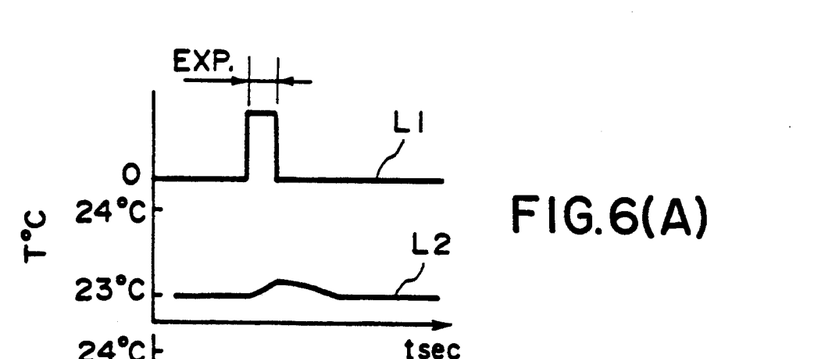
FIGS. 6(A) and 6(B) illustrate operation of the cooling system of FIG. 5.
Figure 6B:
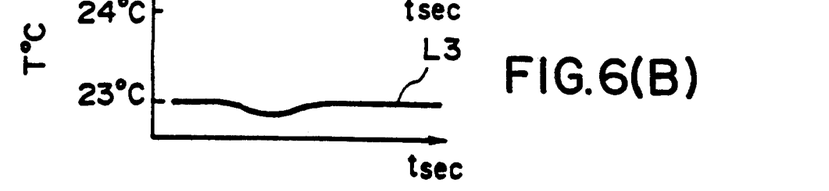

Referring to FIGS. 5 and 6, the description will be made as to the cooling of the blade BLD. In FIG. 5, there are provided cooling water containers TNK1 and TNK2, which contain water maintained at 23.5° C. and 10° C., respectively. The cooling water delivered from the cooling water tank TNK1 is subjected to a heat exchanging operation by a heat exchanger TEX with the cooling water delivered from the cooling water container 2, so that the temperature of the cooling water from the container TNK1 is decreased to a temperature $T_B$ °C. which is lower than 23.5° C. It is then passed through the passage CLP in the blade BLD, and is returned to the container TNK1. The cooling water containers TNK1 and TNK2 are disposed at such a position as is sufficiently away from the unit wherein the alignment is performed, by which the alignment operation is not influenced by heat.

Temperature sensors TSNI and TSNO are disposed adjacent to an inlet and outlet of the cooling passage in the blade BLD. The sensor may include a thin film resistance element of platinum or a thermistor. The outputs of the temperature sensor TSNI and TSNO are supplied to a controller CNT, and are used as data for controlling a degree of opening of a proportional controlling valve LNV. From the cooling water container TNK2, a constant rate of the cooling water is supplied, and the proportional control valve LNV controls a ratio of the rate of the cooling water flowing to a bypass pipe BP and the rate flowing into the heat exchanger TEX, by which the temperature $T_B$ of the cooling water supplied into the passage of the blade BLD is controlled to be the set temperature by the controller CNT.

The exposure operation will be described. Generally, the exposure beam is projected onto the mask MSK for a predetermined period of time controlled by a shutter or the like, and therefore, thermal energy is produced in the blade BLD as shown by a curve L1 in FIG. 6(A). For example, when the exposure period is 1 sec, and the energy absorbed by the blade BLD is 50 mJ, approximately 1.22 cc/sec of the water flows to suppress the temperature rise to be approximately 1/100° C. by constant rate of the cooling water having the constant temperature of 23° C. In view of the fact that the cooling is necessary only during the exposure operation, it is effective to decrease the temperature of the cooling water down to less than 23° C. in timed relation with the exposure operation, as shown by a line L3 in FIG. 6(B). This is accomplished by the control of the controller CNT in timed relation with the exposure operation using the signal SIN from the main controller, as shown in FIG. 5. The energy absorbed by the blade BLD changes in accordance with the size of the view angle and the change in the intensity of the beam source. When, for example, a constant rate of the cooling water having the constant temperature of 23° C. is supplied during the exposure operation, the temperature sensor TSNO produces a temperature change output as shown by a reference L2 in FIG. 6, and a control table for the proportional control valve ALV is made on the basis of the data.

As described in the foregoing, according to this embodiment, even when the exposure beam is not reflected, as in the case of X-rays, and the exposure beam energy is converted into thermal energy in the blade BLD, the produced heat is transmitted outside the apparatus, using cooling water, and therefore, the heat transfer around the blade is suppressed, to enable the highly precise alignment of the blade to be accomplished.

In this embodiment, the temperatures of the two cooling water systems are 23.5° C. and 10° C., but the present invention is not limited to those values. From the standpoint of suppressing the heat transfer from the blade BLD to the other member, the blade mounting portion may be made of low thermal conductivity material such as ceramic material, by which the temperature is more easily controlled.

Figure 7:
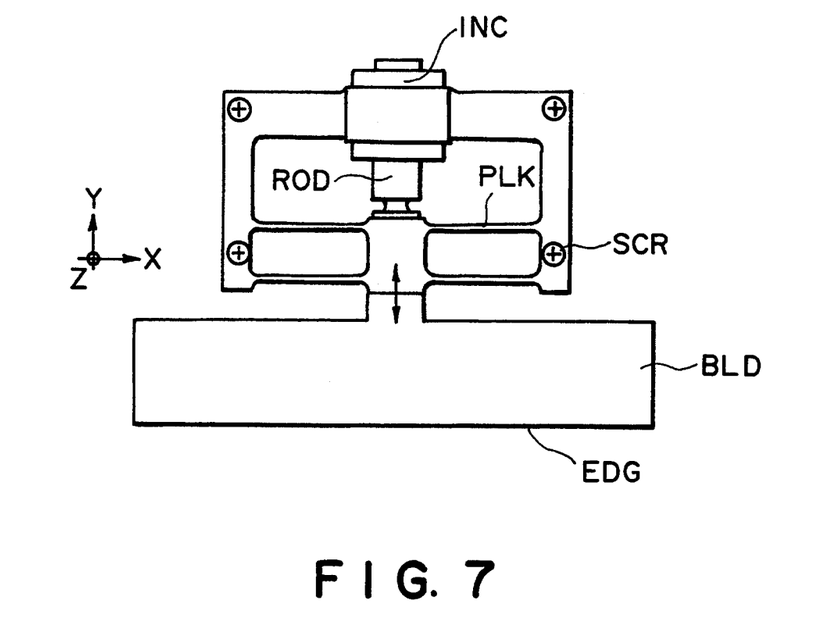
FIG. 7 is a top plan view of a major portion of an apparatus according to another embodiment of the present invention.

Referring to FIG. 7, another embodiment of the present invention will be described. This Figure shows the portion of the blade BLD having connectors for the cooling type in FIG. 1, as seen from the radiation source side. As contrasted to FIG. 1, a parallel link PLK for supporting the blade BLD for movement in the Y (X) axis direction and an inch worm INC are connected through a rod ROD to the back side of the blade BLD in series. The unit is mounted on the alignment unit AAU by four screws SCR. In the embodiment of FIG. 1 wherein an exposure beam having a divergence angle is used, an inside edge of the beam blocking area formed by an edge EDG of the blade BLD fixed on the alignment unit AAU approaches the outside edge of the scribe line, and therefore, the blade BLD on the alignment unit AAU is set to meet the minimum view angle $l_{min}$ for safety. In order for the distance between the inside edge of the beam blocking area provided by the edge EDG and the outside edge of the scribe line to be constant, the amount of projection of the blade is corrected in consideration of the equation (1). Using the dimensions of the FIG. 1 embodiment, that is, $d_{min}=0.225$ mm, and $d_{max}=0.45$ mm, the difference is 0.225 mm. This is a stroke required to be corrected in the amount of blade projection in consideration of the size of the view angle.

In this embodiment, the actuator is constituted by the inch worm INC, and the guiding mechanism is constituted by a parallel link PLK, and therefore, sufficient stroke and accuracy required for the correction can be provided. In addition, the parallel link PLK does not have a scribing portion, and therefore, no particles are produced. The inch worm INC used for the actuator hardly produces heat after the positioning, so that it does not influence the other constituent elements.

Figure 8:
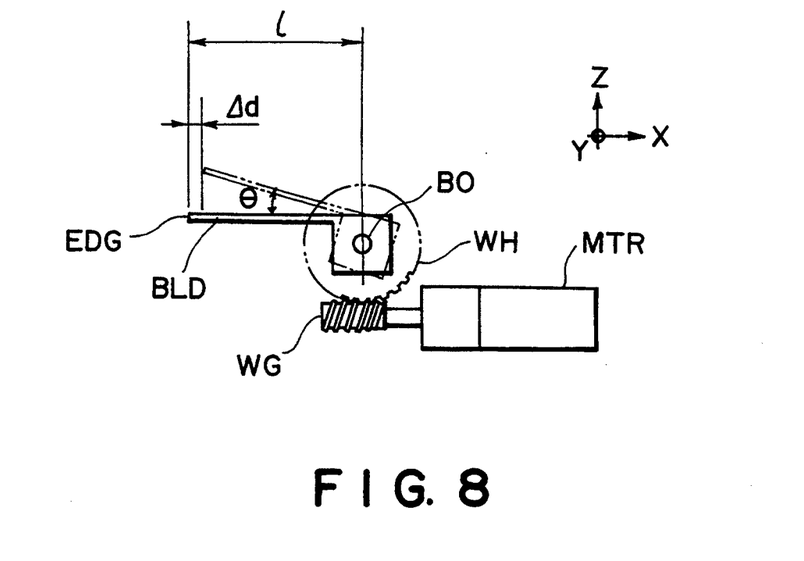
FIG. 8 is a side view of a major portion of an apparatus according to a further embodiment of the present invention.

FIG. 8 shows another example of a mechanism for correcting the amount of projection of the blade.

In this Figure, blade BLD is seen in the y direction. In this Figure, a reference BO designates a common rotational center of the blade BLD and the worm wheel WH. The blade edge EDG is rotatable about this center by operation of a small size motor MTR with a reduction mechanism.

When, for example, the distance from the blade edge EDG to the rotational center BO1 is 20 mm, and the stroke required for the correction is 0.225 mm (same as the above), a necessary stroke can be obtained by rotating the blade BLD by approximately $\theta=8.6°$.

In this example, the amount of projection of the blade edge EDG relative to the exposure beam can be controlled without use of an expensive linear movement guide.

As described in the foregoing, according to this embodiment, the means for detecting the deviation between the substrate and the original and the means for limiting the exposure beam are made integral, so that they are integrally positioned. This eliminates the necessity of positioning means exclusively for the exposure beam limiting means. Therefore, the size of the apparatus is reduced, and the reliability of the apparatus is improved. Furthermore, when the exposure beam limiting means is made integral with the deviation detecting means, the unnecessary irradiation area of the exposure beam projected on the original is minimized, and in addition, the beam blocking area does not extend into the pattern, for any size of the view angle, and therefore, the unnecessary energy absorbed by the original can be minimized.

The exposure beam limiting means is provided with cooling means to externally transmit the exposure beam energy absorbed by the exposure beam limiting means, and therefore, the thermal deformation is prevented, thus improving the alignment accuracy and reducing the line width of the exposure pattern which can be produced by the apparatus.

Figure 9:
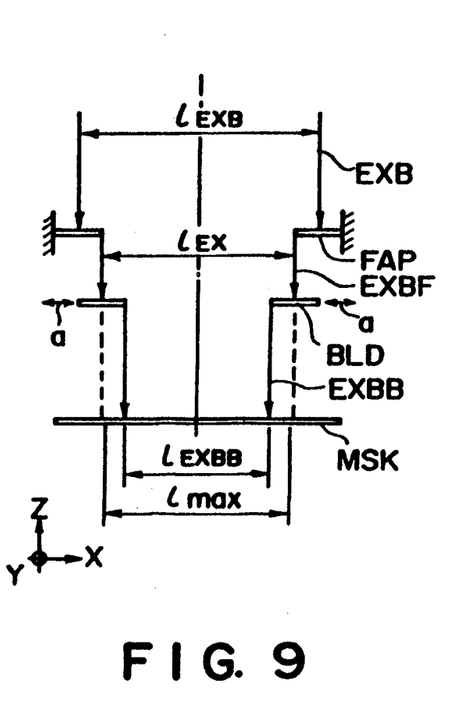
FIG. 9 is a schematic view illustrating the relation between the blade and the exposure beam in the apparatus of FIG. 1.

FIG. 9 shows the relationship between the blade BLD and the exposure beam EXB, and it is a schematic view as seen in the direction y. The exposure beam EXB is first limited by the fixed aperture stop FAP, so that the view angle is limited from $l_{EXB}$ to $l_{EX}$. The limited exposure beam is indicated by a reference EXBF. The maximum exposure view angle of this apparatus is indicated by $l_{max}$. The size of the aperture of the fixed aperture stop FAP is so determined that the limited exposure beam EXBF irradiates slightly beyond the maximum exposure view angle. The exposure beam EXBF having passed through the fixed aperture FAP is further limited by the blade BLD fixed on the alignment unit AAU. The further limited exposure beam is depicted by a reference EXDB. The size of the view angle of the further limited exposure beam EXBB is $l_{EXBB}$ on the mask MSK.

Figure 11A:
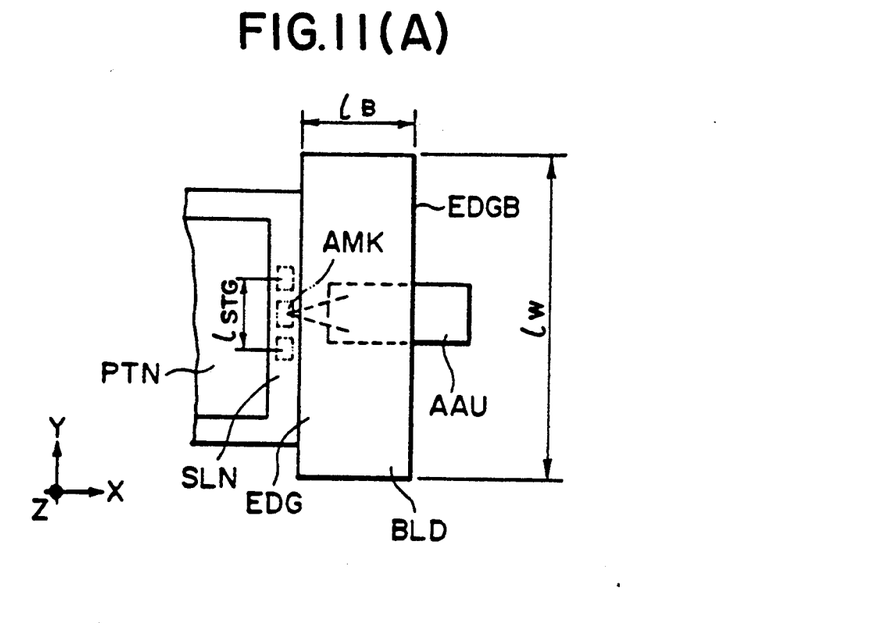
FIGS. 11a and b show an alignment mark and the blade of the FIG. 1 apparatus.
Figure 11B:
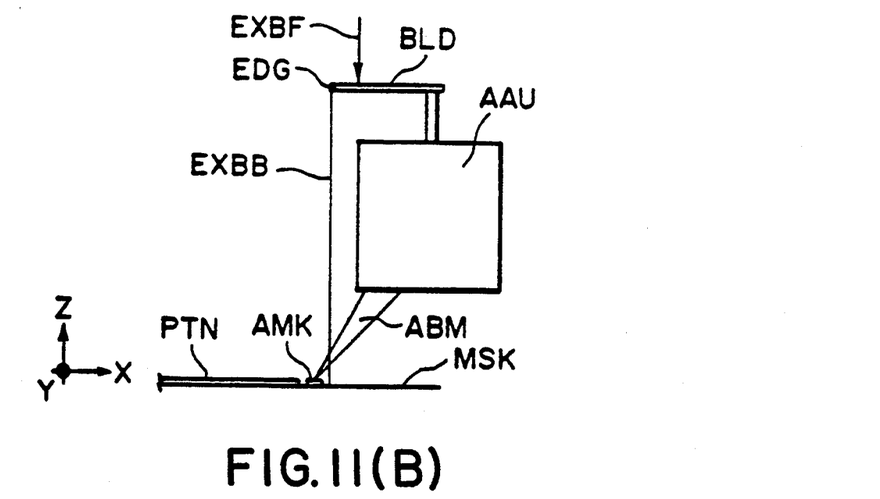

FIGS. 11(A) and 11(B) show the relationship between the alignment mark and the blade. FIG. 11(A) is a top plan view as seen from the radiation source side; and FIG. 11(B) is a side view thereof.

When the alignment unit AAU is placed at such a position that the alignment beam ABM accesses the alignment mark AMK in the scribe line SLN, the exposure beam EXBB is blocked by the blade edge EDG at a position slightly outside the outer edge of the scribe line SLN. The blade BLD is fixedly mounted on the alignment unit AAU in the manner described in the foregoing so as to satisfy this.

In FIG. 11(A), a center of the alignment mark AMK in the scribe line SLN is within an area $l_{STG}$. The blade BLD has a length $l_w$ measured along the edge EDG, that is, in the Y axis direction in this Figure, wherein the length $l_w$ is $l_{max}+l_{STG}+\alpha$, when the maximum exposure view angle is $l_{max}\times l_{max}$. Also, the blade BLD has a length $l_B$ measured in the direction perpendicular to the edge EDG, that is, in the X axis direction in this Figure, wherein the length $l_B=(l_{EX}-l_{min})/2+\alpha$, where the minimum exposure view angle is $l_{min}\times l_{min}$. A length $\alpha$ is determined in consideration of an assembly error, a positioning error and diffraction or the like. As an example, $\alpha$ is equal to approximately 1 mm.

When the view angle changes in the structure described above, the scribe line SLN moves in the direction perpendicular to the blade edge EDG in accordance with the change of the view angle, and simultaneously, the alignment mark AMK on the scribe line also moves in the direction perpendicular to the blade edge EDG.

Figure 10A:
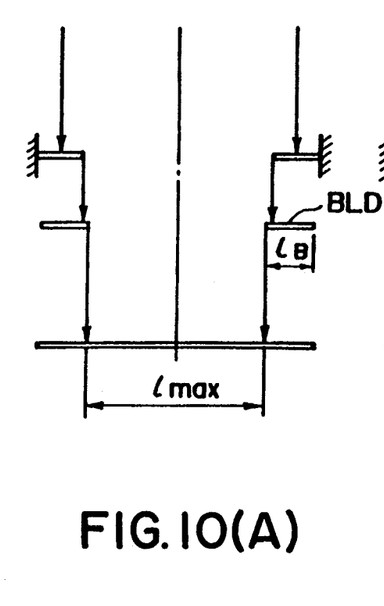
FIGS. 10(A) and 10(B) are schematic views illustrating a relationship between the blade and the exposure beam and the operation of the apparatus of FIG. 1.
Figure 10B:
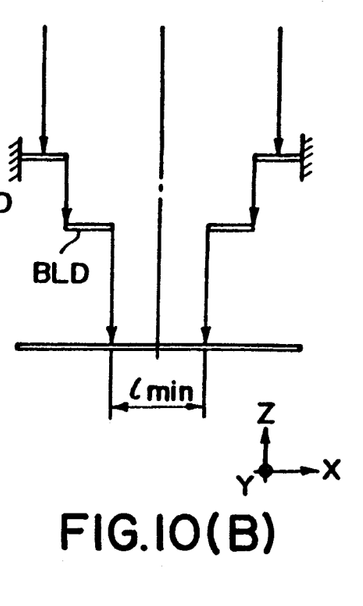

FIG. 10(A) shows the position of the blade BLD at the time of the maximum exposure view angle $l_{max}$; and FIG. 10(B) shows the position of the blade BLD at the time of the minimum exposure view angle $l_{min}$. As shown in this Figure, since the length $l_B$ is $(l_{EX}-l_{min})/2+\alpha$, the edge EDG can block the exposure beam while maintaining the relationship between the alignment mark AMK and the exposure beam EXBB shown in FIG. 3, when the alignment unit AAU is moved, and the blade BLD is positioned in accordance with the size of the view angle. At the time of the minimum exposure view angle, an edge EDGB opposite from the edge EDG of the blade BLD does not extend into the view angle $l_{EX}\times l_{EX}$ defined by the fixed aperture FAP, so that the portion outside the exposure view angle is completely blocked.

The description will be made as to the case where the position of the alignment mark AMK in the scribe line SLN changes along the scribe line SLN. When the position where the alignment mark AMK is formed moves along the scribe line SLN, the alignment unit AAU also moves in parallel with the scribe line SLN, and the blade BLD fixed integrally on the alignment unit AAU also moves, similarly to the blade BLD.

Figure 12A:
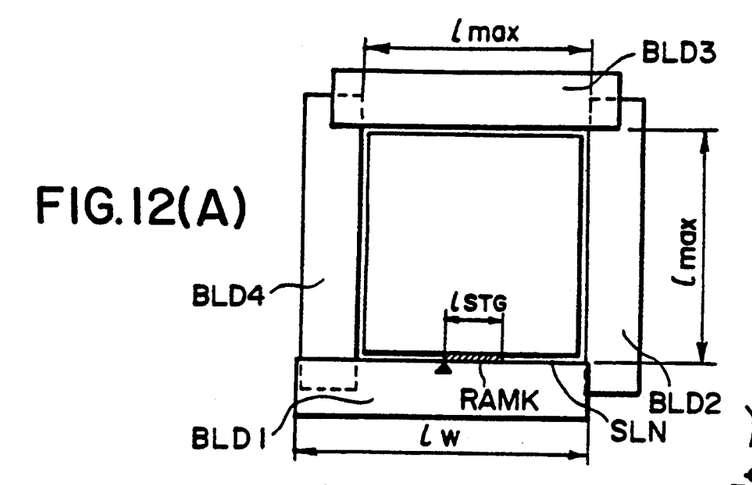
FIGS 12a-c illustrate movement of the blade in the FIG. 1 apparatus.
Figure 12B:
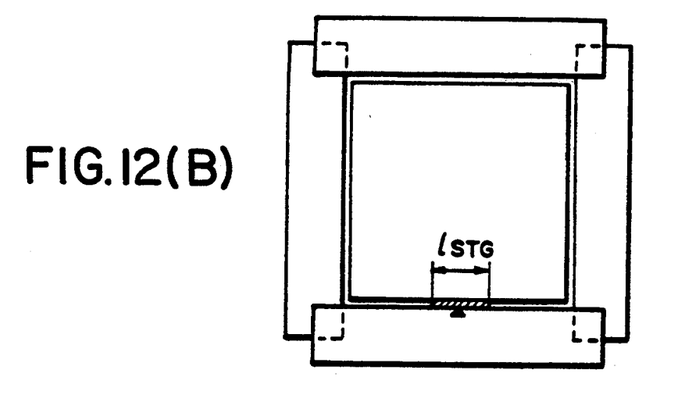
Figure 12C:
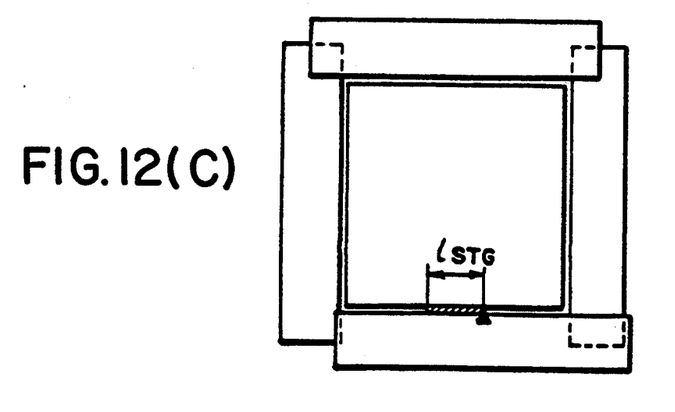

FIGS. 12(A)–12(C) movement of the blade BLD fixed on the alignment unit AAU, in accordance with the position of the alignment mark AMK. The adjacent blades are placed at different levels, as shown in FIG. 1, to avoid interference therebetween. For the simplicity of explanation, only one blade BLD1 of the four blades is moved. In this Figure, the "solid triangle" indicates the central position of the alignment mark AMK. FIG. 12(A) shows the state wherein the alignment mark is at the leftmost position; 12(B) shows the state wherein it is generally at the center; and 12(C) shows the state wherein it is at the rightmost position. In those Figures, the exposure view angle is maximum.

As described in the foregoing, the longitudinal dimension of the blade BLD1, measured in the X axis direction in this Figure, $l_w$ is $l_{max}+l_{STG}+\alpha$, and therefore, the four blades BLD1, BLD2, BLD3 and BLD4 establish a regular square having a length $l_{max}$ of the sides by the overlapping of the adjacent edges, irrespective of the position of the alignment mark at the maximum exposure view angle. On the basis of the relationship between the exposure beam EXDB and the scribe line SLN shown in FIG. 11, the exposure beam is limited. Since the exposure beam is limited properly at the time of the maximum exposure view angle, the exposure beam can be also properly limited when the exposure view angle is a regular square or another rectangular shape having a length of side which is not more than $l_{max}$.

The size $l_{EX}\times l_{EX}$ of the fixed aperture FAP is only slightly larger than the maximum exposure view angle $l_{max}\times l_{max}$, and therefore, almost all of the unnecessary exposure beam is blocked by the fixed aperture FAP, and the region corresponding to the change of the view angle is blocked by the blades BLD fixed on the alignment unit AAU, the area of the blade BLD being minimized.

When the exposure beam source produces X-rays, the radiation incident on the exposure beam limiting means is not reflected but is absorbed, and therefore, it is converted to thermal energy. However, according to this embodiment, almost all of the unnecessary portion of the exposure beam is absorbed by the fixed aperture FAP, and only a minimum amount of an unnecessary portion of the exposure beam is absorbed by the blade BLD fixed on the alignment unit AAU. Therefore, the heat production attributable to absorption of the X-rays adjacent to the alignment unit AAU wherein the spatial positions of optical elements therein have to be maintained accurately, can be minimized.

As described in the foregoing, according to this embodiment, the area of the blade moved and positioned integrally with the alignment unit for limiting the exposure beam is minimized in consideration of the moving region of the alignment unit and the view angle. Therefore, the space around the alignment unit is enlarged for accommodation of other parts, while maintaining the sufficient exposure beam limiting function.

While the invention has been described with reference to the structures disclosed herein, it is not confined to the details set forth and this application is intended to cover such modifications or changes as may come within the purposes of the improvements or the scope of the following claims.

What is claimed is:

1. A semiconductor device manufacturing method comprising:
   disposing a substrate so that an alignment unit is disposed between the substrate, along a path of radiation including X-rays, and a fixed aperture for confining the radiation;
   moving a blade integrally with the alignment unit along a surface of the substrate, the blade being disposed between the fixed aperture and the alignment unit;
   supplying the blade with cooling liquid;
   detecting an alignment mark on the substrate for alignment of the substrate by the alignment unit;
   defining an exposure area of the substrate roughly by the fixed aperture and finely by the blade;
   further confining the radiation confined by the fixed aperture; and
   applying the radiation to the substrate.

2. A microdevice manufacturing method comprising:
   disposing a substrate so that an alignment unit is disposed between the substrate, along a path of radiation including X-rays, and a point of origin of divergence of the X-rays;

moving a blade integrally with the alignment unit along a surface of the substrate, the blade being disposed between the point of origin and the alignment unit;

detecting an alignment mark on the substrate for alignment of the substrate by the alignment unit;

applying the radiation, confined by the blade, to the substrate; and cooling the blade with cooling liquid.

3. A microdevice manufacturing method comprising:

disposing a substrate so that an alignment unit is disposed between the substrate, along a path of radiation including X-rays, and a point of origin of divergence of the X-rays;

moving a blade integrally with the alignment unit along a surface of the substrate, the blade being disposed between the point of origin and the alignment unit;

detecting an alignment mark on the substrate for alignment of the substrate by the alignment unit;

applying the radiation, confined by the blade, to the substrate; and moving the blade relative to the alignment unit.

4. An apparatus wherein a substrate is exposed to exposure energy containing x-rays through a mask to transfer a pattern of the mask onto the substrate, comprising:

a plurality of alignment units each for detecting a relative positional relation between the mask and the substrate, using an alignment mark;

a plurality of stage units for moving said respective alignment units along a plane of the pattern of the mask; and a plurality of blades having rectilinear edges for limiting the exposure energy, each of said blades being disposed at a position which is nearer to a position where the exposure energy is emitted than said alignment units, and being movable integrally with an associated one of said alignment units, wherein an amount D of projection of each of said edges in a plane perpendicular to irradiation of the exposure energy into an angle of view of the irradiation area defined by the blade satisfies $D < L_A \times l_{min}/(2 \times L_M)$, where $L_M$ is a distance between the emitting position of the exposure energy and the mask measured in the direction of the irradiation of the exposure energy, $L_A$ is a distance between the edge of said blade to the mask measured in the same direction, and $l_{min}$ is a minimum width of an exposure area defined by said blades in which the exposure energy is irradiated.

5. A method of exposing a substrate with an exposure beam including X-rays to manufacture a semiconductor device, said method comprising:

disposing the substrate at a position more remote from a first blade for limiting the exposure beam than an alignment unit;

moving the alignment unit along a surface of the substrate integrally with a second blade disposed nearer to the first blade than the alignment unit;

detecting by the alignment unit an alignment mark provided on the substrate to correctly position the substrate;

exposing the substrate to the exposure beam limited by the first blade and further limited by the second blade; and supplying the second blade with cooling liquid.

6. A method of exposing a substrate with an exposure beam including divergent x-rays to manufacture a semiconductor device, said method comprising:

disposing the substrate at a position more remote from a point of origin of divergence of the X-rays than an alignment unit;

moving the alignment unit along a surface of the substrate integrally with a blade disposed nearer to the point of origin than the alignment unit;

detecting by the alignment unit an alignment mark provided on the substrate to correctly position the substrate;

exposing the substrate to the exposure beam limited by the blade; and supplying the blade with cooling liquid.

7. A method of exposing a substrate with an exposure beam including divergent X-rays to manufacture a semiconductor device, said method comprising:

disposing the substrate at a position more remote from a point of origin of divergence of the X-rays than an alignment unit;

moving the alignment unit along a surface of the substrate integrally with a blade disposed nearer to the point of origin than the alignment unit;

detecting by the alignment unit an alignment mark provided on the substrate to correctly position the substrate;

exposing the substrate to the exposure beam limited by the blade; and moving the blade relative to the alignment unit.

8. An exposure apparatus for exposing a substrate to exposure energy containing x-rays through a mask to transfer a pattern of the mask onto the substrate, comprising:

a first blade for limiting the exposure energy;

an alignment unit for detecting a relative positional relation between the mask and the substrate using an alignment mark;

a stage unit for moving said alignment unit in a plane of the original; and a second blade for further limiting the exposure energy limited by said first blade, said second blade being mounted on said alignment unit for integral movement with the alignment unit, wherein said second blade has a width measured in a predetermined direction which is slightly larger than $(l_{EX} - l_{min})/2$, where $l_{EX}$ is a length, measured in the predetermined direction, of the exposure angle of view which is irradiated by the exposure energy and which is defined by said first blade; and $l_{min}$ is a length measured in the predetermined direction of a minimum exposure region which is defined by said second blade.

9. An apparatus according to claim 8, wherein a length of said second blade measured in a direction crossing the predetermined direction is slightly larger than $(l_{STG} + l_{max})$, where $l_{STG}$ is a distance through which said alignment unit moves in the crossing direction; and $l_{max}$ is a length, measured in the predetermined direction, of a maximum exposure region which is defined by said second blade.

10. An apparatus according to claim 9, wherein a plural number of sets of said alignment units and said blades are provided, and wherein said blades are mounted on respective alignment units with said blades having linear edges.

11. An apparatus according to claim 10, wherein four of said alignment units are disposed around the mask at orientations which are different by 90 degrees, wherein adjacent ones of said second blades are disposed at different position in a direction of irradiation of the exposure energy.

12. An exposure apparatus wherein a substrate is exposed to exposure energy containing x-rays through a mask to transfer a pattern of the mask onto the substrate, comprising:

an alignment unit for detecting a relative positional relation between the mask and the substrate, using an alignment mark;

a stage unit for moving said alignment unit along a plane of the pattern of the mask;

a blade for limiting the exposure energy, said blade being disposed at a position which is nearer to a position where the exposure energy is emitted than said alignment unit, and being movable integrally with said alignment unit; and a fine movement mechanism for mounting said blade on said alignment unit for movement relative to said alignment unit.

13. An exposure method for exposing a substrate to exposure energy containing X-rays through a mask to transfer a pattern of the mask onto the substrate, said method comprising:

limiting the exposure energy by a first blade;

detecting a relative positional relation between the mask and the substrate using a movable alignment unit;

further limiting by a second blade the exposure energy limited by the first blade, the second blade being mounted on said alignment unit for integral movement with the alignment unit, wherein the second blade has a width measured in a predetermined direction which is larger than $(l_{EX}-l_{min})/2$, where $l_{EX}$ is a length, measured in the predetermined direction, of the exposure angle of view, which is irradiated by the exposure energy and which is defined by the first blade, and $l_{min}$ is a length measured in the predetermined direction of a minimum exposure region, which is defined by the second blade.

14. A method according to claim 13, wherein the exposure energy is synchrotron radiation.

15. A method according to claim 13, wherein a length of the second blade measured in a direction crossing the predetermined direction is slightly larger than $(l_{STG}+l_{MAX})$, where $l_{STG}$ is a distance through which the alignment unit moves in the crossing direction and $l_{MAX}$ is a length, measured in the predetermined direction, of a maximum exposure region which is defined by the second blade.

16. A method according to claim 15, further comprising providing a plural number of sets of the alignment units and the blades, and wherein the blades are mounted on respective alignment units with the blades having linear edges.

17. A method according to claim 16, further comprising disposing four of the alignment units around the mask at orientations that are different by 90 degrees, wherein adjacent ones of the second blades are disposed at different positions in a direction of irradiation of the exposure energy.

* * * * *

UNITED STATES PATENT AND TRADEMARK OFFICE
CERTIFICATE OF CORRECTION

PATENT NO. : 5,390,227
DATED : February 14, 1995
INVENTOR(S) : Nobutoshi MIZUSAWA, et al.

It is certified that error appears in the above-indentified patent and that said Letters Patent is hereby corrected as shown below:

ON THE COVER PAGE:

IN THE ABSTRACT:

Line 5, "tains" should read --tained--.

COLUMN 4:

Line 25, "FIGS. 11a and b" should read --FIGS. 11(A) and 11(B)--;
Line 27, "FIGS. 12a-c" should read --FIGS. 12(A)-12(C)--; and
Line 38, "and," should read --and--.

COLUMN 8:

Line 60, "EXDB." should read --EXBB.--.

UNITED STATES PATENT AND TRADEMARK OFFICE
CERTIFICATE OF CORRECTION

PATENT NO. : 5,390,227
DATED : February 14, 1995
INVENTOR(S) : Nobutoshi MIZUSAWA, et al.

It is certified that error appears in the above-indentified patent and that said Letters Patent is hereby corrected as shown below:

<u>COLUMN 13</u>:

Line 7, "at" should read --at a--.

Signed and Sealed this

Sixth Day of June, 1995

Attest:

BRUCE LEHMAN

*Attesting Officer*    *Commissioner of Patents and Trademarks*